April 9, 1968 J. A. ELLETT ET AL 3,377,516

CORDWOOD PACKAGE WITH REMOVABLE PLUGS

Filed Aug. 4, 1966

John A. Ellett,
Berton B. Brinker, Jr.,
Robert B. Love,
INVENTORS.
BY J. K. Haskell
ATTORNEY.

3,377,516
CORDWOOD PACKAGE WITH REMOVABLE PLUGS

John A. Ellett, Berton B. Brinker, Jr., and Robert B. Love, Los Angeles, Calif., assignors to Hughes Aircraft Company, Culver City, Calif., a corporation of Delaware Filed Aug. 4, 1966, Ser. No. 570,354
1 Claim. (Cl. 317—101)

ABSTRACT OF THE DISCLOSURE

There is disclosed parallel circuit boards with components extending transversely therebetween, and connected to terminals located opposite each other on each of the boards. One of the terminals is on a tapered plug seated in a tapered hole in one of the boards. By disconnecting the component lead from the terminal opposite the plug, the plug can be removed from the hole, thereby withdrawing the component through the hole.

The present invention relates to improvements in modular electrical circuit designs and, more particularly, to a novel mounting which allows the electrical components supported thereby to be individually removed and replaced as desired.

In many electronic systems, space is at a premium. In such systems, compact circuit modules have been proposed with mountings supporting a maximum number of components in a minimum of space. Due to the highly compact nature of such modules, however, the electrical components are effectively permanently mounted in place relative to each other. Under such conditions, a failure or undesired change in the operating characteristics of even a single component requires that the entire circuit module and mounting be replaced and discarded. Needless to say, this can be a very expensive proposition, wasteful of good circuit components and mountings.

Accordingly, it is an object of the present invention to provide an improved circuit module design which overcomes the disadvantage of conventional compact circuit modules.

Another object of the present invention is to provide a compact mounting for electrical components wherein the components are readily and individually removable from the mounting as desired.

A further object of the present invention is to provide a mounting of the foregoing character which is simple in design and easy and relatively inexpensive to manufacture.

To accomplish the foregoing, one form of the invention includes a pair of terminal boards spaced from and substantially parallel to each other. One of the boards includes a plurality of holes. The holes are large enough to receive electrical components for mounting between the boards, are aligned with electrical terminals carried by the other board, and are designed to tightly receive removable electrical terminal carrying plugs. The electrical terminals are adapted to connect to the end wires of the components whereby the components may be securely mounted between the boards and each may be individually removed and replaced simply by disconnecting one end wire and removing the associated plug.

The foregoing as well as other objects and advantages of the present invention may be more clearly understood by reference to the following detailed description when taken with the drawing which, by way of example only, illustrates one form of circuit module and mounting embodying the features of the present invention.

Figure 1:
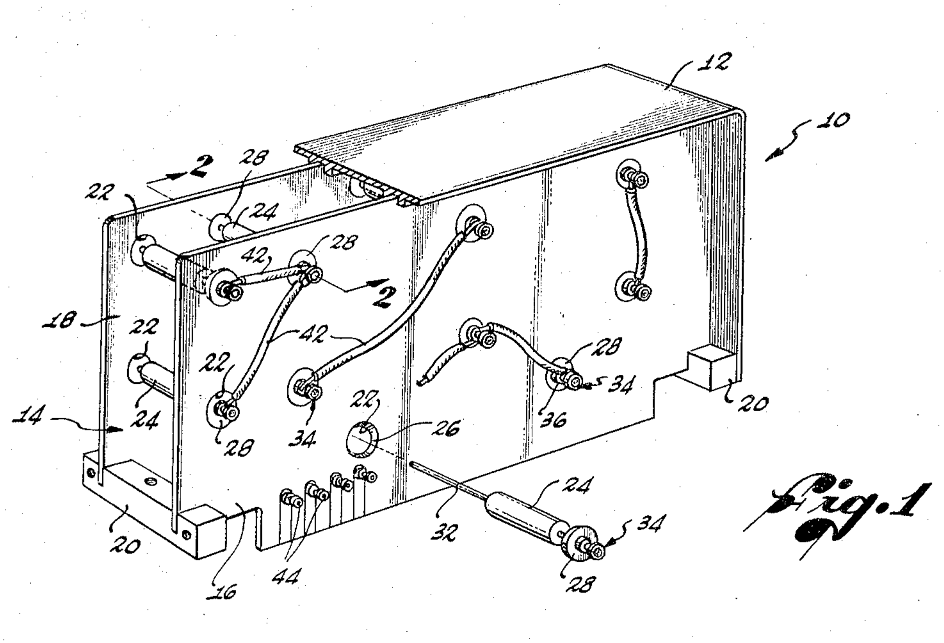
FIGURE 1 is a perspective view of a circuit module employing a mounting constructed in accordance with the present invention.

In the drawing, the circuit module is represented generally by the numeral 10 and includes a metal cover 12 housing an electrical circuit mounting 14. The circuit mounting 14 includes a pair of parallel terminal boards 16 and 18 separated from each other by spacer blocks 20 in the manner most clearly illustrated in FIGURE 1.

Figure 3:
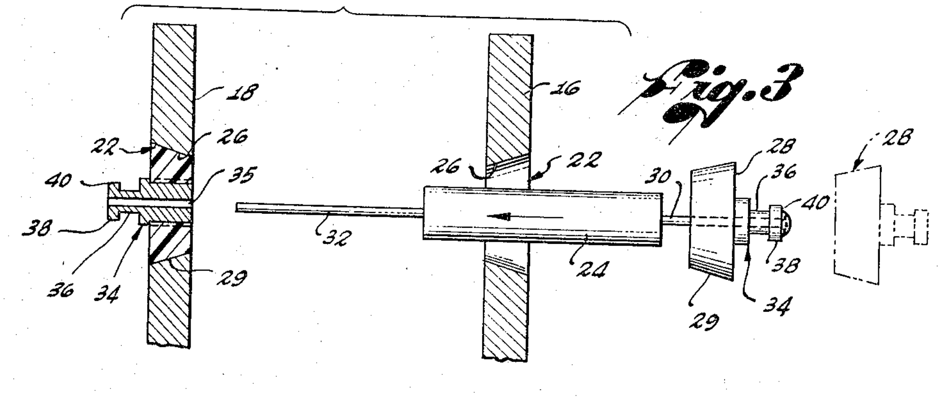
FIGURE 3 is a fragmentary sectional view similar to FIGURE 2, showing the electrical component and plug in displaced positions.
Figure 2:
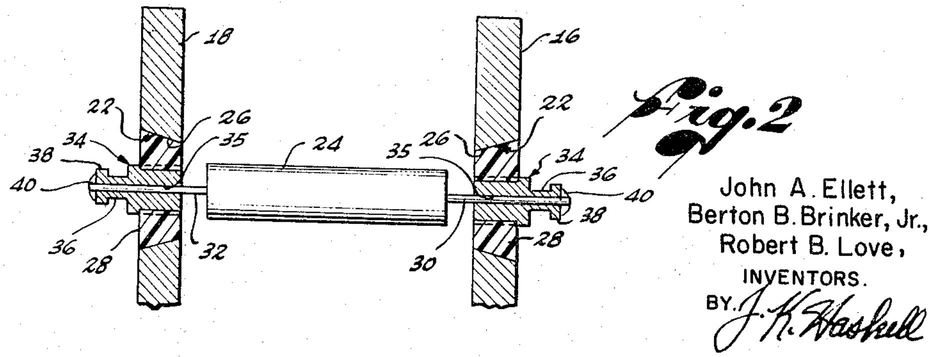
FIGURE 2 is a fragmentary sectional view taken along the line 2—2 in FIGURE 1 and illustrating the manner in which an electrical component is supported within the mounting illustrated in FIGURE 1.

The terminal boards 16 and 18 are formed of insulating material and include a plurality of holes 22. Preferably, corresponding holes 22 in the terminal boards 16 and 18 are coaxial with each other and large enough to receive electrical components 24 for mounting between the boards. Also, as represented most clearly in FIGURES 2 and 3, the holes 22 include axially, outwardly inclined, annular inner walls 26 defining seats for terminal carrying plugs 28.

In the illustrated form, the plugs 28 are frusto-conical discs formed of insulating material with outer annular surfaces 29 adapted to mate with and seat tightly upon the annular inner walls 26 of corresponding holes 22 in the terminal boards 16 and 18.

The electrical components 24 extend between the terminal boards 16 and 18 with end wires 30 and 32 thereof received and connected to terminal means 34 carried by the plugs 28. Preferably, the terminal means 34 comprise metal, tubular terminal posts molded into and extending through and outwardly from the plugs 28 with central openings 35 for receiving the end wires 30 and 32. Preferably, the terminal posts include annular portions 36 of reduced radial dimension which define annular end collars 38 having flat outer faces 40 to which the ends of the end wires 30 and 32 may be connected, as by soldering.

As illustrated most clearly in FIGURE 1, the annular portions 36 of reduced radial dimension also define areas about which the ends of connecting wires 42 may be wound and secured. The wires 42 provide means for interconnecting different ones of the components 24 in the circuit module 10 to complete the desired electrical circuit configuration.

Also, as part of the circuit configuration, printed wiring may be included in the terminal boards 16 and 18 and may be connected to the electrical components 24 by wiring (not shown) between electrical components and terminals such as 44 extending from the terminal board 16 and connected to the printed wiring.

From the foregoing, it is appreciated that the electrical components 24 are easily inserted in place between the terminal boards 16 and 18 and may be readily and individually removed and replaced as desired. In particular, in constructing the circuit module 10, the terminal boards 16 and 18 are first secured in place by the spacer blocks 20. Next, the end wire 30 of each component 24 is slipped into the tubular terminal post 34 of a different plug and connected to the post's end collar 38. The electrical components 24 are then passed through different ones of the holes 22 in the terminal board 16 and the end wires 32 slipped into tubular terminal posts 34 in plugs 28 already seated within corresponding holes 22 in the terminal board 18. Finally, the ends of the end wires 32 are secured to their receiving terminal posts 34 to complete the connection for the electrical components 24 between the terminal boards 16 and 18 and the wires 42 are connected to particular terminal posts to complete the circuit module 10.

When it is desired to replace an electrical component 24, the end of one of its end wires, such as 30, is first disconnected from its associated terminal post 34, as by melting the solder connecting the end wire to the post. The electrical component 24 is then removed from the mounting 14 by pulling the opposite end plug 28 from its seat in the board 18 and passing the component through the hole 22 in the terminal board 18. A separate component then may be substituted in the manner previously described for the initial set-up of the electrical components between the terminal boards 16 and 18.

In the foregoing manner, the present inventon provides an improved, highly compact circuit module whereing the electrical components are readily and individually removable from the mounting for replacement as necessary. In addition, the mounting as well as the module, is simple in design and inexpensive to manufacture using conventional molding techniques.

While a particular form of circuit module and mounting has been described in some detail herein, changes and modifications may be made in the illustrated form without departing from the spirit of the present invention. For example, rather than including a pair of plugs for each component, a single plug may be utilized. Under such conditions, one of the terminal posts associated with each component would be carried by a first one of the terminal boards, as by molding directly into the board. The second one of the boards would include holes aligned with the terminal posts and adapted to receive the electrical terminal carrying plugs. To mount an electrical component within such an arrangement, one end wire of the component would be connected to the electrical terminal in a plug. The component would then be inserted through one of the holes in the second board and the other end wire passed through the terminal post aligned therewith. When the plug was tightly seated in the hole, the other end wire would be connected to the terminal post. To remove the component, the foregoing operation would be reversed.

In view of the foregoing, as well as other changes and modifications which may be made in the illustrated form of the invention, it is intended that the present invention be limited in scope only by the terms of the following claim.

We claim:

1. An electronic circuit module for high-density mounting of electrical components, and in which a component can easily be removed or replaced, comprising:

a pair of spaced substantially parallel boards of insulating material, a first of said boards having a hole therein large enough to pass an electrical component therethrough for mounting transversely between said boards, said hole including an axially inclined annular inner wall, the direction of the taper being such that the smaller diameter of said hole is closest to the second of said boards;

a first terminal means carried by the second of said boards opposite said hole receiving a first lead wire of said component;

a removable plug of insulating material seated in said hole, said plug comprising a frusto-conical disc having an outer surface for mating with and seating upon said inner wall;

and, a second terminal means carried by said plug for connecting to a second lead wire of said component, whereby said component can easily be removed by disconnecting said first lead wire from said first terminal and withdrawing said component through said hole by removing said plug from said hole.

References Cited

UNITED STATES PATENTS

| | | |
|---|---|---|
| 2,749,484 | 6/1956 | Levitt. |
| 3,088,191 | 5/1963 | Breiling. |
| 3,213,325 | 10/1965 | Lindstrand. |

ROBERT K. SCHAEFER, *Primary Examiner.*

D. SMITH, *Assistant Examiner.*